United States Patent
Vuille et al.

(10) Patent No.: US 10,648,068 B2
(45) Date of Patent: May 12, 2020

(54) METHOD FOR IMPLANTING SINGLE OR MULTIPLY CHARGED IONS INTO A SURFACE OF A TREATED OBJECT AND DEVICE FOR IMPLEMENTATION OF THE METHOD

(71) Applicant: The Swatch Group Research and Development Ltd, Marin (CH)

(72) Inventors: Pierry Vuille, Les Emibois (CH); Roger Cochand, Arbaz (CH); Jean-Luc Bazin, Tuscherz-Alfermee (CH); Csilla Miko, Essertines-sur-Yverdon (CH); Arne Kool, Blonay (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 16/313,594

(22) PCT Filed: Apr. 12, 2018

(86) PCT No.: PCT/EP2018/000200
§ 371 (c)(1),
(2) Date: Dec. 27, 2018

(87) PCT Pub. No.: WO2018/188804
PCT Pub. Date: Oct. 18, 2018

(65) Prior Publication Data
US 2019/0352763 A1   Nov. 21, 2019

(30) Foreign Application Priority Data

Apr. 13, 2017   (EP) .................................. 17166644

(51) Int. Cl.
*C23C 14/00* (2006.01)
*C23C 14/48* (2006.01)
(Continued)

(52) U.S. Cl.
CPC .......... *C23C 14/0015* (2013.01); *C23C 14/48* (2013.01); *G02B 1/113* (2013.01); *G02B 1/12* (2013.01); *H01J 37/32678* (2013.01)

(58) Field of Classification Search
CPC ....... C23C 14/0015; H01J 37/00; H01J 37/02; H01J 37/06; H01J 37/08; H01J 37/26;
(Continued)

(56) References Cited

U.S. PATENT DOCUMENTS

| 4,278,890 A | 7/1981 | Gruen et al. |
| 4,361,762 A | 11/1982 | Douglas |

(Continued)

FOREIGN PATENT DOCUMENTS

| GB | 2 084 792 A | 4/1982 |
| WO | WO 2015/176850 A1 | 11/2015 |

OTHER PUBLICATIONS

International Search Report dated Jul. 13, 2018 in PCT/EP2018/000200 filed Apr. 12, 2018.

*Primary Examiner* — Jason L McCormack
(74) *Attorney, Agent, or Firm* — Oblon, McClelland, Maier & Neustadt, L.L.P.

(57) ABSTRACT

A method for single or multiply charged ion implantation into a surface of a treated object, and a device for implementing the implantation method, the method including: directing towards the surface of the treated object an ion beam produced by an ion source of the electronic cyclotron resonance type; producing at least one primary electron beam and directing the primary electron beam so that it passes through the ion beam; and producing a secondary electron beam by reflecting the primary electron beam onto a target once the primary electron beam has traversed the ion beam, the target being oriented such that the secondary electron beam falls onto the surface of the treated object.

19 Claims, 3 Drawing Sheets

(51) Int. Cl.
*G02B 1/113* (2015.01)
*G02B 1/12* (2006.01)
*H01J 37/32* (2006.01)

(58) Field of Classification Search
CPC .... H01J 37/30; H01J 37/3002; H01J 37/3007; H01J 37/3171
USPC ............ 250/306, 307, 309, 310, 311, 492.1, 250/492.2, 492.3
See application file for complete search history.

(56) References Cited

U.S. PATENT DOCUMENTS

| | | | |
|---|---|---|---|
| 5,136,171 A | | 8/1992 | Leung et al. |
| 5,587,587 A | * | 12/1996 | Hashimoto ........... H01J 37/026 250/251 |
| 6,005,253 A | * | 12/1999 | Kong .................. H01J 37/3171 250/492.21 |
| 6,329,650 B1 | * | 12/2001 | Dudnikov ................ G21K 1/14 250/251 |
| 2015/0276487 A1 | * | 10/2015 | Krampert ................ G01J 5/02 250/338.3 |
| 2015/0376058 A1 | | 12/2015 | Busardo et al. |
| 2017/0107641 A1 | * | 4/2017 | Busardo ............. C23C 14/0015 |
| 2017/0114442 A1 | | 4/2017 | Guernalec et al. |

* cited by examiner

METHOD FOR IMPLANTING SINGLE OR MULTIPLY CHARGED IONS INTO A SURFACE OF A TREATED OBJECT AND DEVICE FOR IMPLEMENTATION OF THE METHOD

FIELD OF THE INVENTION

The present invention concerns a surface treatment method for an object, especially but not exclusively made of synthetic sapphire, by means of a single or multiply charged ion beam. This method aims to reduce undesirable reflections from the surface of an object, for example made of synthetic sapphire, and to improve long-term the light transmission of such a material in the visible wavelength spectrum. The method according to the invention is particularly intended to be applied to the anti-reflective surface treatment of a synthetic sapphire watch crystal in order to improve its light transmission characteristics. In these conditions, the surface of the watch crystal has good anti-reflective properties in the visible light range. More generally, the present invention applies to any type of electrically conductive, semi-conductor or electrically insulating material, for the purpose of improving the surface mechanical features, in particular resistance to scratches, of objects made using such materials by means of the ion implantation method according to the invention.

BACKGROUND OF THE INVENTION

Sapphires or corundums are formed of aluminium oxide crystals ($Al_2O_3$) whose colour is determined by the presence of trace impurities (oxides) in these materials. It is thus known that the presence of titanium and iron gives a sapphire a blue colour, the presence of vanadium a violet colour and the presence of chromium a pink colour. Finally, the presence of iron in a sapphire gives the latter a yellow or green appearance.

This colouration can be explained by the fact that the impurities cause the appearance of energy levels in the forbidden gap of corundum, which modify the transmission and absorption spectra of the material and therefore its colour.

Sapphire can be heat treated; stones that are too light or too dark or have too many inclusions are heated. This heat process enhances the colour and improves the brilliance of the stones by dissolving the trace impurities present in the stone.

The laboratory manufacture of synthetic sapphires and rubies has been known since the beginning of the 19th century. The chemical composition and physical properties of these synthetic stones are the same as those of natural stones. Synthetic stones can, however, be distinguished from natural stones by their generally curved crystallisation lines, at least as regards the oldest manufactured synthetic stones.

Because of its high scratch-resistance, synthetic sapphire is used, in particular, for making watch crystals or lenses in optical cameras, especially in smart phones. Nowadays, the production of synthetic sapphires is carried out on an industrial scale.

It is well known that a synthetic sapphire surface reflects around 15% of incident light, which hinders the reading of information displayed by a watch dial, a flat computer or mobile telephone screen.

The light reflectivity value of a synthetic sapphire surface is obtained using Fresnel's equations which, for a light ray passing through a dioptre at an angle of incidence of 90°, give the following reflection (R) and transmission (T) coefficients:

$$R=((n2-n1)/(n2+n1))^2$$

$$T=4n1*n2/(n2+n1)^2$$

where n1 and n2 are the reflection indices of the mediums separated by the dioptre.

Taking account of the principle of energy conservation, one obtains R+T=1.

For air (n1=1) and synthetic sapphire (n2=1.76), one obtains, with the above formulae: R=0.0758, T=1−R=0.9242. In other words, 7.6% of the visible light that falls perpendicularly on a synthetic sapphire surface is reflected, and 92.4% of this light is transmitted.

For a strip of synthetic sapphire formed of an entry face and an exit face which extend parallel to and remote from each other, the optical losses are two times higher and are thus around 15%. This high reflection of ambient light makes it difficult to read the information displayed, for example, by a watch dial (hands, date indication, decorations) located under the synthetic sapphire watch crystal.

There are anti-reflective methods consisting in depositing metal oxides which are relatively complex and expensive to implement. For example, for watch crystals, one of the methods used consists of the vacuum deposition ($10^{-5}$ torr) of metal oxide thin films. In dust-free enclosures of the white room type, the watch crystals are first cleaned in cleaning lines and then ultrasonic dried. These watch crystals are then mounted on supports which are inserted into vacuum chamber Bell jars. The vacuum inside these vacuum chamber Bell jars allows the evaporation by sublimation of a metal oxide at a lower temperature than under atmospheric pressure. Evaporation can be achieved by Joule heating the metal oxide or by bombarding the oxide using an electron gun. The quality of the vacuum, the speed of evaporation and the thickness of the deposited films must be perfectly controlled. These thicknesses must of course be uniform.

There are other, less expensive, types of vapour phase depositions (also known as physical vapour deposition or PVD) which consist in depositing magnesium fluoride $MgF_2$ (optical refractive index 1.38) or cryolite $Na3AlF6$ (optical refractive index 1.35). The refractive indices of these materials are close to one another, but their scratch-resistance properties are inferior to those of synthetic sapphire. PVD depositions made on synthetic sapphire to improve its anti-reflective properties can be scratched, or peel off, thereby completely removing any advantage that could be obtained for synthetic sapphire.

'Synthetic sapphire' means a material transparent to visible light. Synthetic sapphire is formed of aluminium oxide (Al2O3). In physical terms, synthetic sapphire is a very hard crystalline material (hardness equal to 9 on the Mohs scale) belonging to the corundum family and which has a very high refractive index equal to 1.76.

More generally, the present invention concerns any type of material such as, but not limited to, synthetic sapphire, polycarbonate, mineral glass or ceramics. The treated materials may be electrically conductive, or semiconductors, or electrically insulating.

Other known surface treatment techniques consist of implanting ions in the surface of a treated object.

These ion implantation methods consist of the surface bombardment of the treated object, for example by means of a source of single or multiply charged ions of the electronic cyclotron resonance type. This type of device is also known as an ECR ion source.

An ECR ion source makes use of electron cyclotron resonance to create a plasma. Microwaves are injected into a volume of low pressure gas intended to be ionised, at a frequency corresponding to the electronic cyclotron resonance defined by a magnetic field applied to an area located inside the volume of gas to be ionised. The microwaves heat the free electrons present in the volume of gas to be ionised. By thermal agitation, these free electrons will collide with the atoms or molecules and cause their ionisation. The ions produced correspond to the type of gas used. This gas may be pure or compound. It may also be a vapour obtained from a solid or liquid material. The ECR ion source is capable of producing single charged ions, i.e. ions whose degree of ionisation is equal to 1, or multiply charged ions, i.e. ions whose degree of ionisation is higher than 1.

Within the scope of the present Patent Application, we are concerned with a single or multiply charged ion source of the ECR type. Very briefly, and as illustrated in FIG. 1 annexed to the present Patent Application, an ECR ion source, designated as a whole by the general reference numeral 1, includes an injection stage 2 into which is introduced a volume 4 of gas to be ionised and a hyperfrequency wave 6, a magnetic confinement stage 8 in which a plasma 10 is created, and an extraction stage 11, which allows the ions from plasma 10 to be extracted and accelerated by means of an anode 11a and a cathode 11b between which a high voltage is applied.

The aspect of ion beam 12 produced at the exit of multiply charged ECR ion source 1 is illustrated in FIG. 2 annexed to the present Patent Application. It is noted that this ion beam 12 tends to diverge at the exit of ECR ion source 1, which can be explained by the fact that the ions, which all have the same electrical sign, tend to repel each other. Since ion beam 12 tends to diverge at the exit of ECR ion source 1, this causes problems of inhomogeneity of ion distribution at the surface of the treated object.

Another problem linked to surface ion implantation of a treated object concerns the gradual appearance of electrostatic potential at the surface of the treated object as the single or multiply charged ions are deposited. Indeed, the higher the number of ions implanted in the surface of the treated object, the higher the electrostatic field, and the more the surface of the treated object tends to repel the ions arriving from the ECR ion source, which also causes problems of inhomogeneity in the method for ion implantation of the treated object. In the case where the treated object is electrically conductive, this problem is less present insofar as at least some of the free or weakly bound electrons of the material from which the treated object is made can recombine with the implanted ions. However, in the case where the treated object is made of a non-electrically conductive material, the phenomenon of recombination between electrons and single or multiply charged ions does not occur, and it is difficult to guarantee homogeneous ion distribution at the surface of the treated object.

SUMMARY OF THE INVENTION

It is an object of the present invention to overcome the aforementioned problems, in addition to others, by providing a method for implanting ions into the surface of a treated object that can ensure, in particular, the homogeneous distribution of said ions in the surface of the object.

To this end, the present invention concerns a method for implanting single or multiply charged ions into a surface of a treated object, this method including the step that consists in directing towards the surface of the treated object, an ion beam produced by a source of single or multiply charged ions of the ECR type, the method also including the step that consists in producing at least one primary electron beam and in directing this primary electron beam so that it passes through the multiply charged ion beam.

According to a complementary feature, the method of the invention also includes a step that consists in producing a secondary electron beam by reflecting the primary electron beam onto a target once the primary electrons have pass through the ion beam, the target being oriented such that the secondary electron beam falls onto the surface of the treated object.

According to another feature of the invention, the treated object is made of a non-electrically conductive material. The material from which the treated object is made is chosen from the group formed by natural and synthetic sapphires, mineral glasses, polymers and ceramics.

According to another feature of the invention, the treated object is made of an electrically conductive material. It particularly concerns crystalline or amorphous metal alloys and precious and non-precious metals.

According to yet another feature of the invention, the material from which the treated object is made is chosen from the group formed by natural and synthetic sapphires, mineral glasses, polymers, crystalline or amorphous metallic alloys, ceramics and precious and non-precious metals.

According to yet another feature of the invention, the atoms that can be implanted in the surface of the treated object by means of the single or multiply charged ECR ion source are chosen from the group formed by nitrogen N, carbon C, oxygen O, argon Ar, helium He and neon Ne.

According to yet another feature of the invention, the nitrogen atoms are obtained by ionisation of a dinitrogen precursor gas, the carbon atoms are obtained by ionisation of a methane precursor gas, and the oxygen atoms are obtained by ionisation of a dioxygen precursor gas.

According to yet another feature of the invention, the surface temperature of the treated object is measured remotely and in real time. A temperature sensor well suited for measuring the surface temperature of a sapphire object is that sold by the French company LumaSense Technologies under the reference IN 5/9 Plus.

According to yet another feature of the invention, the electrical potential of the surface of the treated object, or the electrical potential of a table that supports the treated object, is measured in real time.

As a result of the present invention, it is thus possible, in particular, to control the charge of the multiply charged ions before they impinge on the surface of the treated object.

It is clear that by directing at least one primary electron beam towards the beam of positively charged ions (or cations), at least some of the electrons will recombine with the cations in the beam. This recombination will cause a reduction, or cancellation of the electrical charge of the cations, such that, very often, it is the neutral particles, carried by their kinetic energy, which will impinge on the surface of the treated object.

Reducing or cancelling out the electrical charge of the single or multiply charged ions of the beam has two very positive consequences: on the one hand, the ions are less likely to repel each other electrostatically, so that the ion beam diverges less; on the other hand, the electrical potential of the surface of the treated object and/or the electrical potential of the table on which the treated object is placed, is lower, so that the surface of the treated object and the table are less likely to repel the ions arriving from the ECR source. It is therefore possible to more precisely control the kinetic energy of the atoms (whether electrically charged or not) that impinge on the surface of the treated object, and thus to more precisely control the quality of the coating formed on the surface of the treated object.

Control of the quality and homogeneity of the surface coating of the treated object is further improved by the use of a beam of secondary electrons obtained after the primary beam electrons have rebounded onto a target, whose orientation is chosen such that the secondary electrons impinge on the surface of the treated object. On falling onto the surface of the treated object, these secondary electrons recombine with the multiply charged ions implanted in the surface, reducing or cancelling out the electrostatic charge of said ions, which also contributes to a reduction in the electrostatic potential of the surface of the treated object and of the table that supports it, and thus to a reduction in the phenomenon of multiply charged ions being repelled by said surface.

Finally, controlling the electrical potential of the surface of the treated object and/or the temperature of said object further improves the precision of control of the kinetic energy of the atoms (whether ionised or not) impinging on the surface of the treated object.

BRIEF DESCRIPTION OF THE DRAWINGS

Other features and advantages of the present invention will appear more clearly in the following detailed description of an example implementation of the method according to the invention, this example being given simply by way of non-limiting illustration in conjunction with the annexed drawing, in which.

DETAILED DESCRIPTION OF ONE EMBODIMENT OF THE INVENTION

The present invention proceeds from the general inventive idea which consists in cancelling out all or part of the electrostatic charge of ions produced by a source of single or multiply charged ions of the ECR type before said ions impinge on the surface of the treated object. By reducing the electrostatic charge of said ions, the latter repel each other less, so that the beam that they form diverges less. Likewise, the atoms (whether neutral or ionised) that impinge on the surface of the treated object are repelled less by the ions already implanted in said surface, so that a more homogeneous surface coating is obtained for the treated object. To achieve this result, the present invention teaches directing an electron beam towards the ion beam. On passing through the ion beam, the electrons recombine with said ions and reduce or cancel out the electrostatic charge of the latter. To reinforce this effect, the present invention proposes placing a target on the path of the electrons once the latter have passed through the ion beam, so that the electrons are redirected towards the surface of the treated object and also contribute to the reduction or cancellation of the electrostatic charges of the ions already implanted in the surface of the treated object. It is an object of the present invention to treat the surface of objects by implanting ions and cancelling out charges in order to improve physical properties, especially mechanical properties (increased surface hardness of objects) and optical properties (reduced surface reflection of the objects made of transparent material).

Figure 1:
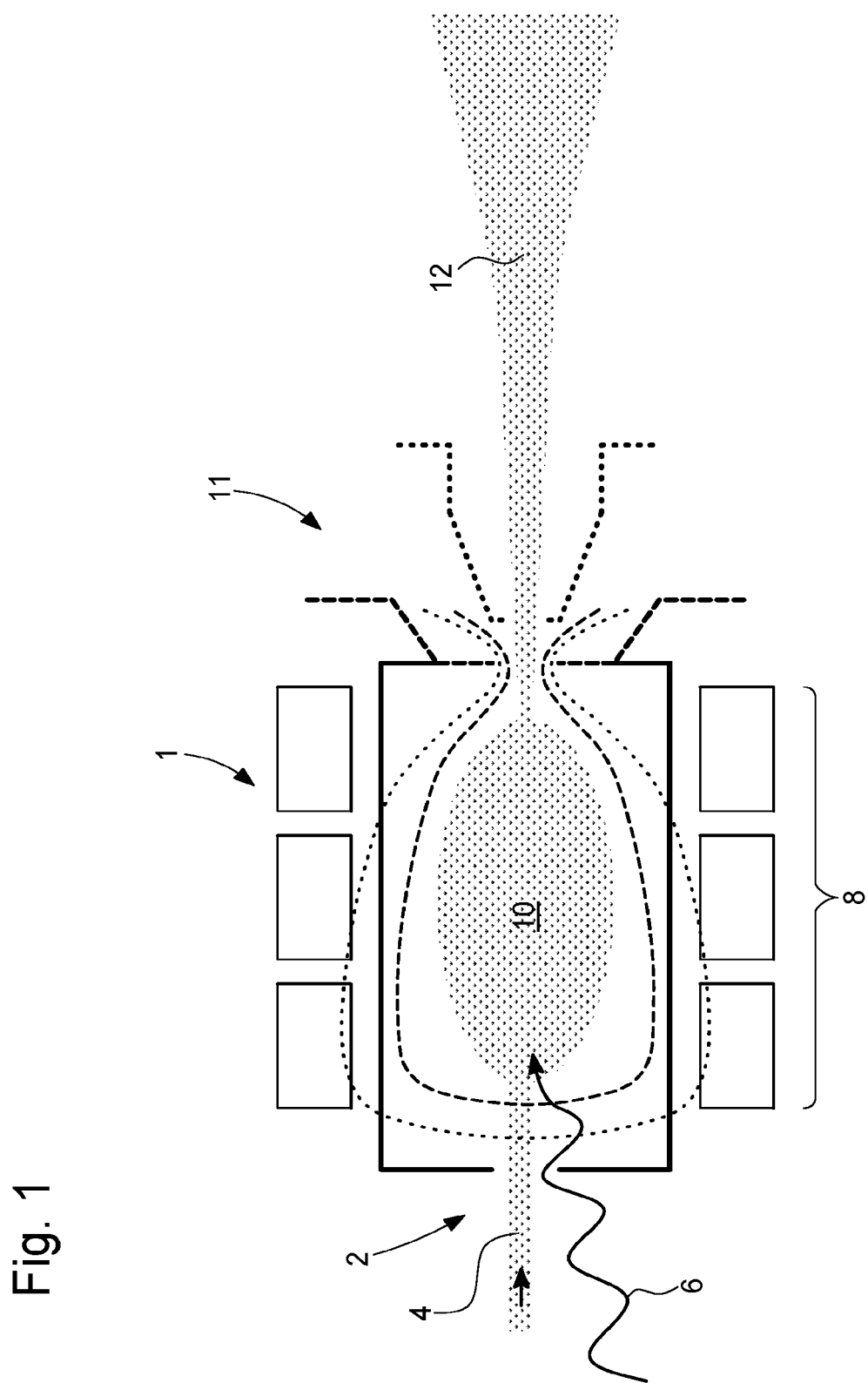
FIG. 1, cited above, is a schematic view of a single or multiply charged ECR ion source according to the prior art.
Figure 2:
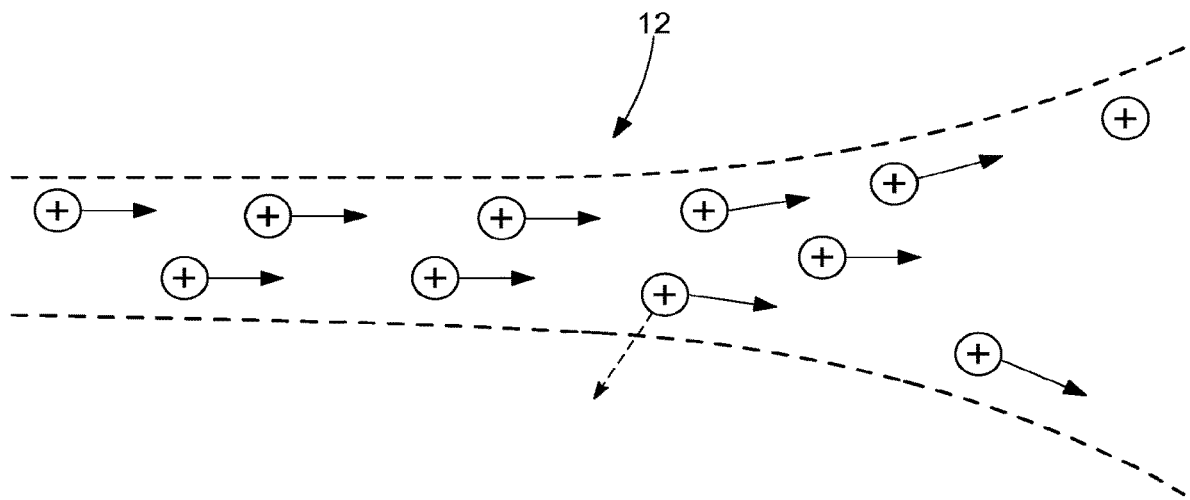
FIG. 2 is a schematic view which illustrates an ion beam at the exit of the single or multiply charged ECR ion source illustrated in FIG. 1.
Figure 3:
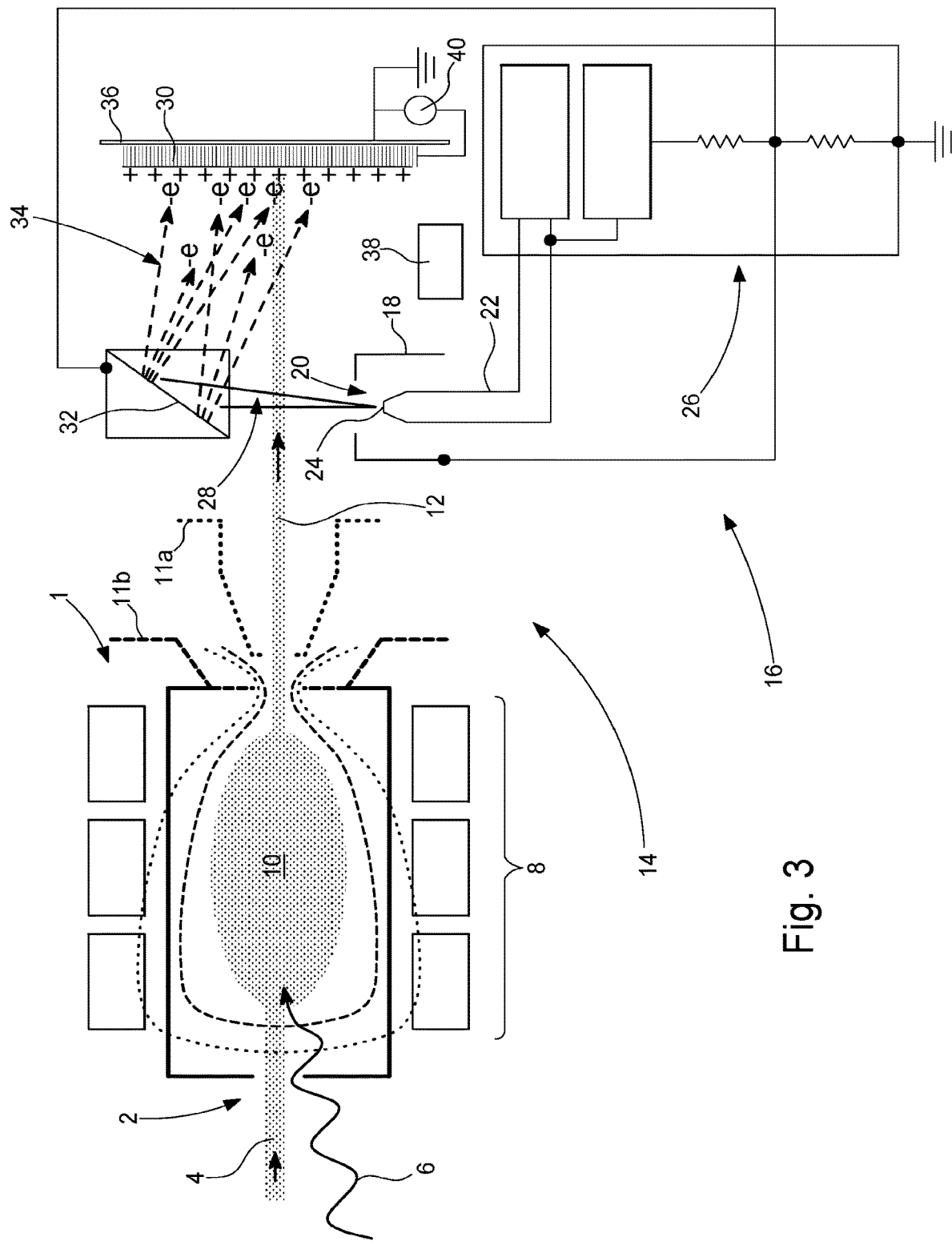
FIG. 3 is a schematic view of a device for implanting single or multiply charged ions into the surface of a treated object according to the invention.

FIG. 3 is a schematic view of a device for implantation of single or multiply charged ions into the surface of a treated object according to the invention. Designated as a whole by the general reference numeral 14, this ion implantation device includes an ECR ion source 1 of the same type as that illustrated in FIG. 1.

According to the invention, there is associated with this ECR ion source 1 an electron gun designated as a whole by the general reference numeral 16. As is known, an electron gun is a device for producing an electron beam by extracting electrons from a conductive material to a vacuum in which they are accelerated by an electrical field.

In the case that concerns us, a cold field emission electron gun is preferably used. To this end, electron gun 16 includes an anode 18, for example made of graphite, in which is arranged an orifice 20, and a metal cathode 22 in the form of a very fine tip 24. A high electrical voltage is applied by means of an electric generator 26 between anode 18 and metal cathode 22. Under the effect of this high voltage, a very intense electrical field is produced by point effect at the end of metal cathode 22. This intense electrical field allows electrons to be extracted by tunnel effect from tip 24 of metal cathode 22 and to be accelerated to create an electron beam 28 which propagates as it passes through orifice 20 arranged in anode 18. For reasons that will appear below, the electrons emitted by electron gun 16 will be called primary electrons.

According to a variant, the extraction of electrons from tip 24 of metal cathode 22 can be heat assisted.

According to the invention, the electron beam 28 produced by electron gun 16 is oriented so that it passes through ion beam 12. On passing through ion beam 12, some of the primary electrons recombine with the ions, which causes a reduction, or cancellation of the electrical charge of said ions, so that, very often, it is neutral atoms (or at least atoms with a lower electrostatic charge) which, carried by their kinetic energy, will impinge on the surface of a treated object 30.

According to a complementary feature of the invention, there is arranged on the path of primary electron beam 28 a target 32, onto which fall the primary electrons that have not recombined with the ions after passing through ion beam 12. Target 32 is oriented such that a secondary electron beam 34, produced by the collision between the electrons of primary electron beam 28 and target 32, impinges on the surface of treated object 30 and a table 36 on which treated object 30 is placed. In this case too, the electrons of secondary electron beam 34 cancel out or reduce the electrostatic charge of the ions implanted into the surface of the treated object.

According to yet another feature of the invention, the surface temperature of treated object 30 is measured remotely and in real time by means of a temperature sensor 38. A temperature sensor well suited for measuring the surface temperature of a sapphire object is that sold by the French company LumaSense Technologies under the reference IN 5/9 Plus.

According to yet another feature of the invention, the electrical potential of the surface of treated object 30, or the electrical potential of a table that supports treated object 30, is measured in real time by means of an electric voltage measuring instrument 40.

The invention also concerns a device for implantation of single or multiply charged ions into a surface of a treated object, this device comprising an ECR ion source 1, and an electron gun 16, ECR ion source 1 producing an ion beam 12 and the electron gun producing a primary electron beam 28, ECR ion source 1 and electron gun 16 being arranged such that primary electron beam 28 intercepts ion beam 12.

The single or multiply charged ion implantation device also includes a target 32 placed on the path of primary electron beam 28 once the latter has passed through ion beam 12. Target 32 is oriented such that a secondary electron beam 34, produced by the collision between the electrons of primary electron beam 28 and target 32, impinges on the surface of treated object 30 and a table 36 on which treated object 30 is placed.

The single or multiply charged ion implantation device also includes a temperature sensor 38 for measuring remotely and in real time the surface temperature of treated object 30.

The implantation device of single or multiply charged ions also includes an instrument 40 for measuring the electrical potential of the surface of treated object 30 and/or of table 36 that supports treated object 30.

Figure 4:
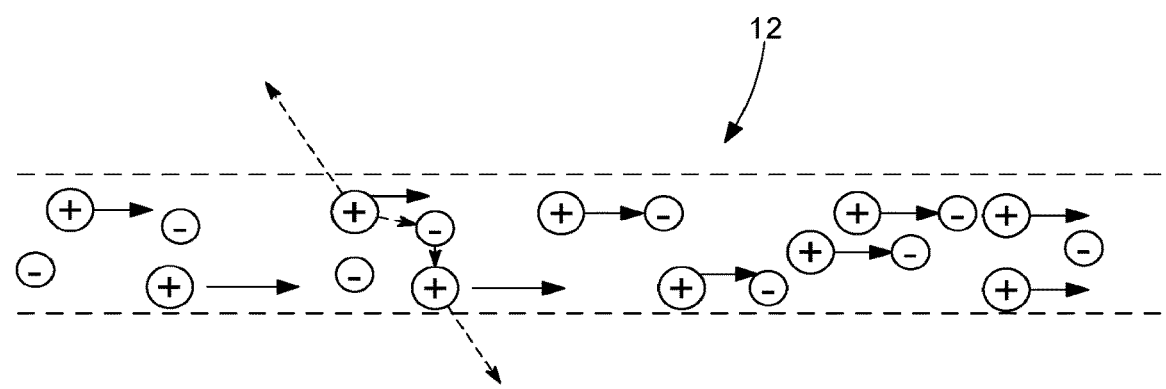
FIG. 4 is a schematic view which illustrates an ion beam at the exit of the single or multiply charged ion source device according to the invention illustrated in FIG. 3.

The aspect of ion beam 12 produced at the exit of ECR ion source 1 after interception by primary electron beam 28 is illustrated in FIG. 4 annexed to the present Patent Application. It is noted that this ion beam 12 diverges very little, if at all, on exiting ECR ion source 1, which can be explained by the fact that the electrical charge of a large number of ions (marked "+") is cancelled out or reduced by the recombination of electrons (marked "−") of primary electron beam 28 with ions of ion beam 12. Since the divergence of primary electron beam 28 is at least greatly reduced, the homogeneity of distribution of multiply charged ions at the surface of treated object 30 is substantially improved.

It is evident that the present invention is not limited to the embodiments that have just been described and that various simple modifications and variants can be envisaged by those skilled in the art without departing from the scope of the invention as defined by the annexed claims. It will be noted, in particular, that the ion implantation dose used lies within a range comprised between $1*10^{16}$ ions/cm$^2$ and $15*10^{16}$ ions/cm$^2$ and that the single or multiply charged ion acceleration voltage is comprised between 7.5 kV and 35 kV. It will also be understood that the present invention applies more particularly, but not exclusively, to the surface treatment of sapphire objects (natural or synthetic sapphire) for the production of watch crystals. As a result of the ion implantation method according to the invention, the amount of incident light reflected by such crystals is considerably reduced, which significantly improves the readability of information displayed by the indicator members (hands, date indication, decorations, etc.) placed under such crystals. The present invention also applies to other types of materials (for example ceramics or crystalline or amorphous metal materials) whose mechanical properties, especially scratch-resistance, are greatly improved when the ion implantation and charge neutralisation method is applied thereto. It will also be noted that the secondary electron beam includes both electrons from the primary electron beam and electrons extracted from the target by the electrodes of the primary electron beam. It will be noted finally that, according to the invention, the ECR ion source is capable of producing single or multiply charged ions, i.e. ions whose degree of ionisation is higher than or equal to 1, wherein the ion beam can include ions that all have the same degree of ionisation or can result from a mixture of ions having different degrees of ionisation.

NOMENCLATURE

1. Electronic cyclotron resonance (ECR) ion source
2. Injection stage
4. Volume of gas to be ionised
6. Hyperfrequency wave
8. Magnetic confinement stage
10. Plasma
11. Extraction stage
11a Anode
11b. Cathode
12. Ion beam
14. Ion implantation device
16. Electron gun
18. Anode
20. Orifice
22. Metal cathode
24. Tip
26. Electric generator
28. Primary electron beam
30. Treated object
32. Target
34. Secondary electron beam
36. Table
38. Temperature sensor
40. Electric voltage measuring instrument

The invention claimed is:

1. A method for implanting single or multiply charged ions into a surface of a treated object, the method comprising:
    directing towards a surface of the treated object an ion beam produced by an ion source of electronic cyclotron resonance type;
    producing at least one primary electron beam and directing the primary electron beam to pass through the ion beam; and
    producing a secondary electron beam by reflection of the primary electron beam from a target once the primary electron beam has traversed the ion beam,
    wherein the target is oriented such that the secondary electron beam impinges on the surface of the treated object and on a table on which the treated object is disposed.

2. The method according to claim 1, wherein the treated object is made of a non-electrically conductive or semiconductor material.

3. The method according to claim 1, wherein the treated object is made of a material chosen from the group: natural and synthetic sapphires, mineral glasses, polymers, ceramics.

4. The method according to claim 2, wherein the treated object is made of a material chosen from the group: natural and synthetic sapphires, mineral glasses, polymers, ceramics.

5. The method according to claim 1, wherein the treated object is made of an electrically conductive material.

6. The method according to claim 5, wherein the treated object is made of a material chosen from the group: crystalline or amorphous metal alloys, ceramics, and precious and non-precious metals.

7. The method according to claim 1, wherein the singly or multiply charged ions that are implanted into the surface of the treated object are chosen from the group: nitrogen, carbon, oxygen, argon, helium, neon.

8. The method according to claim 7, wherein the nitrogen atoms are obtained by ionization of a dinitrogen precursor gas, the carbon atoms are obtained by ionization of a methane precursor gas, and the oxygen atoms are obtained by ionization of a dioxygen precursor gas.

9. The method according to claim 1, wherein the treated object has a surface temperature which is measured remotely and in real time.

10. The method according to claim 1, wherein an electrical potential of the surface of the treated object or an electrical potential of a table that supports the treated object is measured in real time.

11. The method according to claim 10,
wherein the surface of the treated object is treated by at least one ion implantation dose that falls within a range between $1*10^{16}$ ions/cm² and $15*10^{16}$ ions/cm², and
wherein an acceleration voltage of the single or multiply charged ions is between 7.5 kV and 35 kV.

12. A device for implanting single or multiply charged ions into a surface of a treated object, the device comprising:
an electronic cyclotron resonance (ECR) ion source and an electron gun,
wherein the ECR ion source produces an ion beam and the electron gun produces a primary electron beam, and
wherein the ECR ion source and the electron gun are arranged such that the primary electron beam intercepts the ion beam; and
a target disposed on a path of the primary electron beam once the primary electron beam has passed through the ion beam,
wherein the target is oriented such that a reflected secondary electron beam, produced by collision between electrons of the primary electron beam which have not recombined with ions of the ion beam and the target, impinges on the surface of the treated object and on a table on which the treated object is disposed.

13. The device for implanting single or multiply charged ions according to claim 12, further comprising a temperature sensor configured to measure remotely and in real time a surface temperature of the treated object.

14. The device for implanting single or multiply charged ions according to claim 12, further comprising an instrument configured to measure an electrical potential of the surface of the treated object and/or of the table that supports the treated object.

15. The device for implanting single or multiply charged ions according to claim 13, further comprising an instrument configured to measure an electrical potential of the surface of the treated object and/or of the table that supports the treated object.

16. The method according to claim 1, wherein the directing of the primary electron beam to pass through the ion beam reduces electrostatic repulsion among ions in the ion beam.

17. The method according to claim 1, wherein the directing of the primary electron beam to pass through the ion beam reduces an electrical potential of the surface of the treated object and/or of the table on which the treated object is disposed.

18. The device for implanting single or multiply charged ions according to claim 12, wherein the arrangement of the ECR ion source and the electron gun such that the primary electron beam intercepts the ion beam is configured to reduce electrostatic repulsion among ions in the ion beam.

19. The device for implanting single or multiply charged ions according to claim 12, wherein the orientation of the target such that the reflection of the secondary electron beam impinges on the surface of the treated object and on the table is configured to reduce an electrical potential of the surface of the treated object and/or of the table on which the treated object is disposed.

* * * * *